United States Patent [19]

Hornbeck et al.

[11] 4,332,853

[45] Jun. 1, 1982

[54] CONDUCTIVE PLASTIC WITH METALIZED GLASS FIBERS RETAINED IN PARTIAL CLUMPS

[75] Inventors: Frederick C. Hornbeck, Sunnyvale, Calif.; James E. Henning, Deerfield Beach, Fla.

[73] Assignees: International Business Machines Corporation, Armonk, N.Y.; Lundy Electronics & Systems, Inc., Pompano Beach, Fla.

[21] Appl. No.: 191,456

[22] Filed: Sep. 26, 1980

Related U.S. Application Data

[60] Division of Ser. No. 931,064, Aug. 4, 1978, Pat. No. 4,258,101, which is a continuation of Ser. No. 795,351, May 9, 1977, abandoned.

[51] Int. Cl.³ .............................................. D02G 3/00
[52] U.S. Cl. ...................................... 428/371; 428/373; 428/375; 428/377; 428/380; 428/381; 428/388; 428/402; 428/404; 428/407
[58] Field of Search ............... 428/371, 373, 375, 377, 428/380, 381, 388, 402, 404, 407

[56] References Cited

U.S. PATENT DOCUMENTS 2,930,105  3/1960  Budd ................................... 428/388
3,709,773  1/1973  Hall ................................... 428/404

FOREIGN PATENT DOCUMENTS 1531272  5/1968  France.

*Primary Examiner*—Marion McCamish
*Attorney, Agent, or Firm*—W. S. Robertson

[57] ABSTRACT

Articles of a thermoplastic having an improved level of electromagnetic shielding are molded from plastic pellets that have a core of metalized glass fibers that are arranged to partially disperse through the molded article as individual fibers and partially to remain in clumps of generally aligned closely contacting fibers. The clumps have approximately the length of an individual fiber but they are substantially wider than an individual fiber. Improved conductivity is attributed to increased electrical bridging between fibers that is provided by the width of the clumps of fibers.

4 Claims, No Drawings

CONDUCTIVE PLASTIC WITH METALIZED GLASS FIBERS RETAINED IN PARTIAL CLUMPS

RELATED APPLICATIONS

This application is a divisional of application Ser. No. 931,064 filed Aug. 4, 1978, which issued Mar. 24, 1981 as U.S. Pat. No. 4,258,101 to Frederick C. Hornbeck, which was a continuation of application Ser. No. 795,351 filed May 9, 1977, now abandoned.

Application Ser. No. 754,939, filed Dec. 28, 1976, entitled "Conductive Plastic And Method of Preparation", now abandoned, has background material that will be helpful in understanding this application and is incorporated by reference in this specification. A continuation in part of this application has issued as U.S. Pat. No. 4,195,114.

INTRODUCTION

Our related application describes an improved technique for producing molded thermoplastic articles that have levels of electrical conductivity that are useful for many purposes. The articles are molded from plastic pellets that contain a core of metalized glass fibers. The glass fibers are metalized as they are drawn from a melt of glass and the metalized fibers are formed into a roving. In the subsequent manufacture of the plastic pellets, the roving and a thermoplastic are drawn from a plastic extruder with the roving forming the core of an extrusion that is chopped into pellets. When an article is molded from these pellets, the fibers of metalized glass are distributed through the article and make it electrically conductive.

As one example of an application for a conductive plastic, an article that has been molded from a plastic that conducts only slightly can be given an electrical charge and can then be painted by electrostatic painting techniques. A more demanding requirement for conductive plastics is presented by enclosures (covers) for electronic apparatus that requires electromagnetic shielding. The cover isolates the apparatus from electromagnetic radiation that could otherwise produce spurious signals in the circuits of unshielded apparatus, and it similarly prevents the apparatus within a shielded cover from transmitting signals to interfere with other nearby apparatus.

The shielding capability of a conductive plastic is measured by first molding a sample plaque of the material to be tested. The plaque has standard dimensions and is mounted in the window of a metal box that contains a radio transmitter. The strength of the radio signal outside the box is measured at various frequencies with the window open and with the window covered by the test plaque. The ratio of the signal measured when the window is open to the signal measured when the window is closed is formed to express the attenuating effect of the test plaque in decibels (db's).

SUMMARY OF THE INVENTION

Conductive plastics are not conductive to the degree that metal conductors are conductive. The metalized glass fibers in the molded article average about a quarter of an inch in length and they provide conductivity to the extent that they fortuitously touch or very nearly touch. (Electromagnetic shielding may also be attributed to capacitive and inductive coupling between isolated fibers.) In an ideal situation, the fibers would have random positions and random orientations so that electrical pathways would extend in three dimensions from each individual fiber. The fibers can be seen readily in special test samples that are molded of clear plastic, and on the surface of the samples the fibers appear to have this random organization superimposed on the general fill pattern that occurs in the surface of the plastic as it flows into the mold. However, when samples are dissected for further analysis it can be seen that within the body of the sample the fibers line up parallel to each other in the direction of the flow of the heated plastic into the mold. The contact between fibers that lie parallel to each other is much reduced from the contact that would be expected from the pattern of random orientation of the fibers that are visible at the surface of a sample.

The random orientation of the fiber at the surface of a plaque probably comes about because friction between the surface of the mold and the flowing plastic causes turbulence in the plastic near the surface. The surface plastic hardens first, entrapping the randomly oriented fibers. Similarly, when a test plaque mold is only partially filled, the leading edge of the plastic partial plaque shows a random orientation of the fibers that is probably caused by turbulence in this region of the flowing plastic mass. The inner portion of the plaques remains hot and molten and produces less turbulence and the fibers in this region are aligned in the general direction of plastic flow during molding.

According to this invention a plastic molding pellet has a core of metalized glass fibers that are arranged to partly disperse as individual fibers (as in the related application) and to partially remain as a clump that has an appreciable cross section as compared with the cross section of an individual fiber. The fibers in a clump have numerous points of contact and thus provide good electrical conductivity throughout the clump. These fiber clumps also line up in the direction of flow of the plastic in a molded article, but they have sufficient width in the direction across the direction of flow to significantly raise the amount of bridging that occurs between fibers in a molded article.

Fibers can be arranged in the core of a molding pellet in various ways that will cause the fibers to partially clump in the molded article. For example, the core can be formed of braided roving of metalized glass fibers. Alternatively, a roving of twisted fibers provides a particularly advantageous technique for producing pellets that cause clumps of fibers in the molded article. To produce a twisted roving, the glass fibers are first formed into sub-bundles and several sub-bundles are twisted about a central sub-bundle in a way that resembles some wire rope. On the other hand, coiling of the fibers, which occurs in some glass making processes, does not provide clumping, probably because the coils are straightened out during pellet manufacture by the tension that is applied to the roving of metalized glass in pellet manufacturing.

We attribute the clumping effect of twisted fibers to the fact that the fibers within the twisted roving do not wet well to the plastic during the pellet manufacture. During a subsequent injection molding operation with these pellets, the previously unwetted fibers are not mixed as well with the plastic and thus tend to remain in their original form as a sub-bundle of the metalized glass roving. Thus, we contemplate that other techniques for isolating a sub-bundle of fibers from the mixing action of the injection molding apparatus will provide good clumping results.

Although the invention adds a step to the glass manufacturing operation, it simplifies the subsequent handling of the metalized glass roving by permitting the usual creeling step to be eliminated.

The following examples will suggest other features and advantages of the invention.

THE EXAMPLES

Introduction

As described later, a number of test plaques were molded at a uniform size of 3"×6"×¼" thick. These plaques are smaller than the plaques used for the tests that are reported in our related application (12"×12"×¼") and were tested in a smaller test chamber, and as a result the shielding results are numerically lower than the results reported in the related application. To show the comparison between the clumped fibers of this specification and the non-clumped glass fibers of the related application, sample 1 was molded from pellets made from a roving of non-clumping, metalized glass fibers. In all of the samples the pellets and the molded product contained approximately 25 Wt% metalized glass fibers. The pellets were ¾" in length and the compositions of the glass and the metal coating were identical in each example. The general conditions of the tests were comparable, and we attribute the improved results of the pellets containing twisted or braided roving to the clumping effect that these pellets produce in a molded test plaque.

The following table shows the shielding levels for samples at frequencies from 12 to 100 megahertz.

| Frequency (meganhertz) | Control | Example 1 | | Example 2 | Example 3 |
|---|---|---|---|---|---|
| | Sample 1 | Sample 2 | Sample 3 | Sample 4 | Sample 5 |
| 12 | 16 | 19 | 21–22 | 18 | 18 |
| 20 | 16 | 19 | 20–21 | 18–19 | 18–19 |
| 30 | 15–16 | 18–19 | 21–23 | 18 | 19–20 |
| 70 | 18–19 | 23–24 | 22–25 | 18–21 | 21–22 |
| 100 | 29–32 | 31–34 | 23–25 | 25–26 | 33 |

THE CONTROL SAMPLE—SAMPLE 1

Three test plaques of structural foam were molded of polycarbonate containing 25 Wt% metalized glass fibers in the form of a straight roving, as described in the related application. The shielding remained below 20 db through 70 megahertz. The shielding of the test sample rose to about 30 db at 100 megahertz. The test was stopped at 100 megahertz. The conductivity of these test samples is suitable for many purposes when general conductivity is desirable, and the shielding capability is suitable for many shielding applications. However, it would be desirable to have shielding levels of about 20 db from the ¼" test samples.

EXAMPLE 1

Metalized glass fibers containing a binder coating as described in the related application were formed into sub-bundles containing 100 fibers that were essentially straight without any twisting. Eight sub-bundles were woven into a braid having 800 fibers. The braid is the pattern commonly used for the outer cylindrical conductor of coaxial cables. The braid had eight crossovers per inch, but we contemplate that any suitable number of cross overs per inch can be used. Two of these braids were used to mold pellets of polycarbonate containing 1600 fibers to produce about 25 Wt% of metalized glass fibers. On the surface, these plaques display large swirl patterns showing the path of the plastic flowing into the mold. A plaque was buffed to improve the contrast between the metalized fibers and the plastic, and at the surface the fibers appeared to have a random 3-dimensional orientation that was generally independent of the swirl patterns.

Samples were subsequently fractured approximately parallel to the direction of flow and across the direction of flow to observe the distribution of the metalized glass fibers. The sample contained both clumps of fibers and individual fibers. The clumps generally retained essentially their initial length and individual fibers appeared in a full range of lengths from dust particles to approximately the length of the original pellets. The clumps appeared to consist of generally parallel, densely packed, fibers and the braid pattern did not appear in the molded test samples. Both the individual fibers and the clumps appeared to be aligned in the direction of flow of the plastic through the mold. The clumps appeared to be scattered at random with approximately ¼" (about the length of a clump) separating nearby clumps.

SAMPLE 2

In sample 2, two test plaques were molded of a mixture of pellets having 50% pellets manufactured with two braids of metalized glass fibers as described in this example and 50% metalized glass fibers having a straight roving as described for the control sample. Thus, the test plaques had 12.5 Wt% of metalized glass fibers in the form of the braid and a total of 25 Wt% glass fibers. As the table shows, a useful improvement in shielding was measured.

SAMPLE 3

In sample 3, three test plaques were molded and tested according to the procedure described for sample 2 except that the pellet mixture had 75% pellets containing the braid of metalized glass and 25% pellets containing the straight untwisted metalized glass fibers. Thus the molded plaques had 18 Wt% metalized glass fibers in the form of a braided roving and 7% metalized glass fibers in the form of the straight roving. The plaques had a shielding level of more than 20 db across the frequency spectrum of the test.

EXAMPLE 2

Metalized glass fibers were formed in the way already described into thirteen sub-bundles that each contained 100 metalized glass fibers. One of these bundles formed a central member of a twisted roving. Six of the sub-bundles were wound clockwise about the central sub-bundle and the remaining six of the sub-bundles were wound counter clockwise about the inner seven sub-bundles. Thus, the roving had a total of 1300 fibers. The twisted roving was used for manufacturing pellets having the roving as a core, in the way already described. The pellets had about 25 Wt% metalized glass fibers.

The sub-bundles were twisted together on laboratory apparatus of the type used for similarly twisting textile fibers. The roving had about one quarter of a turn per inch. Although this is only three quarters of a turn along the length of a pellet, the fiber sub-bundles showed interlocking at a cut end of a roving and did not readily come apart. Commercial equipment for similarly twisting textile fibers is available and we contemplate that about eight turns per inch will be desirable. A minimum tension is required on metalized glass fibers to prevent linting which occurs when tension is too low, probably because relative motion of the fibers of a sub-bundle occurs under low tension and the fibers abrade each other. A maximum tension is established by the tension at which the roving will break. It appears that within these limits the tension on the sub-bundles is not critical except that the sub-bundles are given equal tension.

SAMPLE 4

Three test plaques were molded of pellets manufactured according to this example (without other pellets). Thus the plaques had about 25 Wt% of metalized glass in the form of a twisted roving. The plaques were tested with the results shown in the table. Although the test results are lower at some frequencies than the samples of example 1, the results are sufficiently better than the control test of sample 1 that for most applications the twisted roving will be the preferred roving form for pellets for the improved shielding of this invention.

Test plaques were fractured at approximately right angles to the direction of flow and approximately parallel to the flow and fibers and clumps of fibers were observed. The pattern of clumps and the individual clumps were essentially indistinguishable from samples molded with the braided roving. The clumps appeared to correspond to the original sub-bundles of about 100 fibers.

Subsequently, the plastic molding pellets of Example 2 were used for molding a multipart cover for a terminal device, and the product tested satisfactorily.

EXAMPLE 3—SAMPLE 5

Three test plaques were molded from a mixture of pellets having 75% pellets containing the twisted roving described in Example 2 and 25% pellets containing the braided roving of Example 1. The plaques were tested with results that are generally comparable to the tests of sample 4. A test plaque was then fractured and the broken edge was inspected with a microscope. The plaque showed both individual fibers and clumps of fibers. There was no apparent difference among the clumps that would show whether clumps arose from the braided roving or from the twisted roving. These results appear to support our belief that the twisted roving will be preferred for most applications.

OTHER EXAMPLES

The pellets of the preceding examples were extruded from polycarbonate but we contemplate that the invention will be used with other plastics that are commonly used with unmetalized glass fibers for both foam and solid plastic molded articles.

A variety of techniques for giving the fibers clumping characteristics will be apparent from the well developed arts of twisting and braiding or otherwise uniting textile fibers, fine metal wires, and the like. For example, outer sub-bundles can be wrapped around an inner sub-bundle with many turns per inch as compared with the twisted sub-bundles of Example 2. Similarly, the inner bundles can be tied together with an outer net-like arrangement of a few fibers. However, it is an advantage of the invention that the roving can be made by simple techniques such as twisting that should not add significantly to the manufacturing cost of the pellet.

From the preceding description of several specific examples of the invention, those skilled in the art will recognize a variety of modification within the scope of the claims.

We claim:

1. A thermo plastic molding pellet for molding articles of plastic and metalized glass fibers by a process in which the fibers disperse through a molded article but tend to become aligned in the general direction of the flow of plastic into a mold and contact between adjacent fibers for electrical conductivity is thereby reduced, comprising,
   a core of metalized glass fibers and an outer body of a thermoplastic,
   wherein the metalized glass fibers in the core of a pellet are arranged with an inner sub-bundle of fibers and an outer grouping of sub-bundles formed about said inner sub-bundle to partially disperse in the molded article as individual fibers and partially to remain as clumps having a thickness that is appreciably greater than the thickness of an individual fiber for improving the fiber to fiber contact in the direction orthogonal to the general direction of plastic flow in a subsequently molded plastic article.

2. The plastic molding pellet of claim 1 wherein said metalized glass fibers are arranged in a twist of sub-bundles of fibers around an inner sub-bundle.

3. The plastic molding pellet of claim 2 wherein said metalized glass fibers are arranged in a twist of a first layer of sub-bundles in one direction about a central sub-bundle and a twist of a second layer of sub-bundles in the opposite direction about said first layer.

4. A thermo plastic molding pellet for molding articles of plastic and metalized glass fibers by a process in which the fibers disperse through a molded article but tend to become aligned in the general direction of the flow of plastic into a mold and contact between adjacent fibers for electrical conductivity is thereby reduced, comprising,
   a core of metalized glass fibers and an outer body of a thermoplastic,
   wherein the metalized glass fibers in the core of a pellet are arranged in a twist of fibers to partially disperse in the molded article as individual fibers and partially to remain as clumps having a thickness that is appreciably greater than the thickness of an individual fiber for improving the fiber to fiber contact in the direction orthogonal to the general direction of plastic flow in a subsequently molded plastic article.

* * * * *